(12) United States Patent
Misumi et al.

(10) Patent No.: US 7,754,416 B2
(45) Date of Patent: Jul. 13, 2010

(54) PROCESS FOR PRODUCING RESIST PATTERN AND CONDUCTOR PATTERN

(75) Inventors: Koichi Misumi, Kawasaki (JP); Koji Saito, Kawasaki (JP); Kaoru Ishikawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 471 days.

(21) Appl. No.: 11/720,180

(22) PCT Filed: Nov. 28, 2005

(86) PCT No.: PCT/JP2005/022242

§ 371 (c)(1),
(2), (4) Date: May 24, 2007

(87) PCT Pub. No.: WO2006/059747

PCT Pub. Date: Jun. 8, 2006

(65) Prior Publication Data

US 2009/0226850 A1    Sep. 10, 2009

(30) Foreign Application Priority Data

Nov. 30, 2004    (JP) .............................. 2004-347771

(51) Int. Cl.
G03F 7/26    (2006.01)
G03F 7/40    (2006.01)

(52) U.S. Cl. .................... 430/318; 430/270.1; 430/311; 430/313; 430/314; 430/322; 430/331

(58) Field of Classification Search ............. 430/270.1, 430/311, 322, 318, 313, 314, 331
See application file for complete search history.

(56) References Cited

U.S. PATENT DOCUMENTS

| 5,342,806 | A | * | 8/1994 | Asahina ...................... 438/608 |
| 5,591,480 | A | * | 1/1997 | Weisman et al. ............... 216/13 |
| 5,738,931 | A | * | 4/1998 | Sato et al. .................... 428/209 |
| 6,759,599 | B2 | * | 7/2004 | Tatoh et al. ................... 174/261 |
| 7,268,490 | B2 | * | 9/2007 | Oota .......................... 313/506 |
| 2003/0087187 | A1 | | 5/2003 | Saito et al. |
| 2004/0038148 | A1 | * | 2/2004 | Ohta et al. ............... 430/270.1 |

FOREIGN PATENT DOCUMENTS

| JP | 2003-140347 | 5/2003 |
| KR | 200413854 | 3/2007 |
| WO | WO 03/036387 A2 | 5/2003 |

OTHER PUBLICATIONS

Combined Office Action and Search Report issued in the counterpart Taiwanese Patent Application No. 094141833, dated Dec. 15, 2008.
International Search Report and Written Opinion of the International Searching Authority for PCT/JP2005/022242 dated Apr. 3, 2006.

* cited by examiner

*Primary Examiner*—Amanda C. Walke
(74) *Attorney, Agent, or Firm*—Knobbe, Martens, Olson & Bear, LLP

(57) ABSTRACT

This process for producing a resist pattern includes: the step of laminating (a) a support having an upper surface on which copper exists, (b) an inorganic substance layer consisting of an inorganic substance supplied from an inorganic substance source, and (c) a photoresist layer consisting of a chemically amplified type positive photoresist composition, to obtain a photoresist laminate, the step of selectively irradiating active light or radioactive rays to said photoresist laminate, and the step of developing said (c) photoresist layer together with said (b) inorganic substance layer to form a resist pattern.

7 Claims, No Drawings

US 7,754,416 B2

PROCESS FOR PRODUCING RESIST PATTERN AND CONDUCTOR PATTERN

RELATED APPLICATIONS

This application is the U.S. National Phase filing under 35 U.S.C. §371 of PCT/JP2005/022242, filed Nov. 28, 2005, which designated the United States and was published in a language other than English, which claims priority under 35 U.S.C. §119(a)-(d) to Japanese Patent Application No. 2004-347771, filed Nov. 30, 2004. The content of these applications is incorporated herein by reference in their entireties.

TECHNICAL FIELD

The present invention relates to a process for producing a resist pattern and a conductor pattern.

BACKGROUND ART

In recent years, the shift from electric circuits in favor of highly integrated circuits such as LSI etc. has progressed rapidly with the downsizing of electric devices. A multi-pin thin film packaging method of forming contacting terminals, each of which consists of a projected electrode on the upper surface of a support such as a substrate, is applied for mounting LSI etc., on the electric device. In the multi-pin thin film packaging method, a contacting terminal which consists of a bump projecting from the support, or a contacting terminal which consists of a strut called "metal post" projecting from the support and a solder ball formed thereon, and the like are used.

Such a bump and a metal post can be formed by, for example, the following steps: forming a thick resist layer having a thickness of approximately not less than 5 µm on an upper surface of a support having a part made of copper on the upper surface thereof, preferably a copper substrate, exposing the resist layer through a predetermined mask pattern, developing it to remove (strip) selectively the part which forms the contacting terminal, thereby forming a resist pattern, filling the part stripped (non-resist part) with a conductor such as copper, gold, nickel, solder, etc., by plating or the like, and finally removing the resist pattern therearound.

On the other hand, a chemically amplified type resist composition using an acid generator is well known as a highly sensitive photosensitive resin composition. In the chemically amplified type resist composition, an acid is generated from the acid generator by irradiation with radioactive rays. The chemically amplified type resist composition is designed such that the generation of acid is promoted to change the alkali solubility of the base resin contained in the resist composition, when the chemically amplified type resist composition is heated after being exposed. A composition having a characteristic such that the nature of being insoluble in an alkali can be converted to be soluble in an alkali is called "positive type", whereas a composition having a characteristic such that the nature of being soluble in an alkali can be converted to be insoluble in an alkali is called "negative type". In this way, the chemically amplified type resist composition acquires a remarkably high photosensitivity superior to that of a conventional resist having a photoreaction coefficient (reaction per 1 photon) of less than 1.

However, hitherto if a photoresist layer is formed on a support which contains copper, using a chemically amplified type resist composition, the copper has the effect of making it difficult to obtain a resist pattern with high accuracy. For example, defects such as film stripping or dropping out may be generated on the resist pattern after being developed.

Patent document 1 (Japanese Unexamined Patent Application, First Publication No. 2003-140347) discloses a technology of laminating a support, and a thick photoresist layer containing a resin of which alkali solubility is changed by an effect of an acid and an acid generator, there being an intervening shielding layer which is constituted from an organic material therebetween for preventing contact between the support and the thick photoresist layer.

However, there is a problem in that the time, the temperature, and the like in the production of the shielding layer must be strictly managed and controlled, because the shielding layer is made from an organic material, and hence the conditions for drying it may differ depending on the thickness, the material, the structure and the like of the under layer of the support.

In addition, mixing of the shielding layer and the photoresist layer may be a problem, in the case in which the shielding layer is made from an organic material. Here, the term "mixing" indicates a phenomenon whereby each of two adjoining layers dissolves to be mixed with each other at the interface therebetween when two or more of layers are laminated.

The present invention was made in view of the above circumstances. It is an object of the present invention to provide a process for forming a resist pattern on a support which has copper on the upper surface thereof, which is capable of reducing the effect of the copper on the resist pattern, easy to control and manage production, and hardly generates the problem of mixing.

DISCLOSURE OF THE INVENTION

In order to attain the above object, the present invention adopted the following constitution.

The process for producing a resist pattern of the present invention includes: the step of laminating (a) a support having an upper surface on which copper exists, (b) an inorganic substance layer consisting of an inorganic substance supplied from an inorganic substance source, and (c) a photoresist layer consisting of a chemically amplified type positive photoresist composition, to obtain a photoresist laminate, the step of selectively irradiating active light or radioactive rays to said photoresist laminate, and the step of developing said (e) photoresist layer together with said (b) inorganic substance layer to form a resist pattern.

The process for producing a conductor pattern of the present invention includes forming a conductive pattern on the non-resist part of the resist pattern obtained by the process for forming a resist pattern of the present invention.

EFFECT OF INVENTION

In the present invention, it is possible to provide a process for forming a resist pattern on a support which has copper on the upper surface thereof, which is capable of reducing the effect of the copper on the resist pattern, easy to control and manage production, and hardly generates the problem of mixing.

BEST MODE FOR CARRYING OUT THE INVENTION

Manufacturing Method of a Resist Pattern

The process for producing a resist pattern of the present invention includes: the step of laminating (a) a support having an upper surface on which copper exists, (b) an inorganic substance layer consisting of an inorganic substance supplied from an inorganic substance source, and (c) a photoresist layer consisting of a chemically amplified type positive photoresist composition, to obtain a photoresist laminate, the step of selectively irradiating active light or radioactive rays to said photoresist laminate, and the step of developing said (c) photoresist layer together with said (b) inorganic substance layer to form a resist pattern.

(Laminating Step)

In the laminating step, it is preferable to produce a laminate by forming (b) an inorganic substance layer (it may be referred to as "(b) layer" for convenience) which is supplied from the inorganic substance source between (a) the support ((a) layer) on an upper surface of which copper exists, and (c) the chemically amplified type positive photoresist layer ((c) layer). This will be explained with respect to an example of the method for laminating the (a) layer, the (b) layer, and the (c) layer in this order below.

It should be noted that in the case of laminating the (a) layer, the (b) layer, and the (c) layer, in this way, it is preferred that the (a) layer, the (b) layer, and the (c) layer be laminated in this order, from a lower part toward an upper part.

In addition, it is also possible to dispose an "other layer" between the (a) layer and the (b) layer, or between the (b) layer and the (c) layer. However, this "other layer" preferably has characteristics which are removed upon being developed. As the "other layer", for example, an adhering layer, an anti-reflective layer, a leveling layer, etc. are exemplary.

First of all, the (a) layer is prepared.

The (a) layer is not limited, as long as copper exists on the upper surface (i.e. the surface on which the (c) layer is laminated) of the (a) layer. For example, a copper substrate, a copper sputtered substrate, a support with copper wiring thereon, etc. are exemplary. Preferably, the (a) layer is a copper substrate, or a copper sputtered substrate, having a large influence on the (c) layer due to copper.

The thickness of the (c) layer is not limited particularly, and can be suitably changed depending on use.

Subsequently, the (b) layer is laminated on the upper surface of the (a) layer.

The (b) layer can be formed, by supplying an inorganic substance from the inorganic substance source to the upper surface of the (a) layer.

Here, the inorganic substance source is one which exists independently from the (a) layer. That is, the (b) layer is distinguished from one derived from the material which constitutes the (a) layer. Accordingly, it is possible to form the (b) layer having desired characteristics by using various materials. Specifically, as the inorganic substance supplying source, for example, a plating solution which is applied to plating; an electrodeposition solution which is applied to electrodeposition; a target which is applied to PVD (Physical Vapor Deposition), CVD (Chemical Vapor Deposition), sputtering, and vapor deposition etc., are exemplary. That is, as a method for forming the (b) layer by supplying an inorganic substance to the upper surface of the (a) layer from the inorganic substance source, PVD (Physical Vapor Deposition), CVD (Chemical Vapor Deposition), sputtering, vapor deposition, plating, and electrodeposition, etc., are exemplary. Among these, in particular, a sputtering method, a vapor deposition method, and a plating method are preferred, because of the ease of formation. It should be noted that one or more of these methods can be applied in combination.

As the inorganic substance, B, C, Mg, Al, Sc, Ti, V, Cr, Mn, Fe, Co, Ni, Zn, Ge, As, So, Zr, Nb, Mo, Ru, Rh, Pd, Ag, Cd, In, Sn, Sb, Te, La, Hf, Ta, W, Re, Ir, Pt, Au, Hg, Tl, Pb, Bi, etc. are exemplary. Moreover, an alloy, or an oxide of these inorganic substances, etc. can also be used. Preferably, at least one selected from the group consisting of Al, Zn, Mo, Sn, Pb, and ITO (Indium-Tin Oxide) is used, because of developing performance, and more preferably, the inorganic substance contains Al. In particular, preferably only Al is used. One or more inorganic substances can be used as a mixture.

The (b) layer is preferably formed so that the thickness becomes 0.05 nm to 1 μm, preferably 3 nm to 1 μm, and more preferably 20 nm to 1 μm, considering that the effect of copper of the (a) layer against the (c) layer is screened.

Subsequently, the (c) layer is laminated on the upper surface of the (b) layer.

The chemically amplified type positive photoresist composition is applied onto the (b) layer, and heating (pre-baking) is performed to remove solvent to form a desired coating film. As a method for coating, a spin-coating method, a roll-coating method, a screen-printing method, an applicator method, a curtain-coating method, etc., can be adopted.

The condition for pre-baking is for approximately 2 to 60 minutes, in general at a temperature of 70 to 150° C., preferably at a temperature of 80 to 140° C., although it differs depending on the kind of each component in the composition, compounding percentage, thickness of the coated film, etc.

As the material for forming the (c) layer, any material can be used with no limitation, as long as it is a chemically amplified type positive photoresist composition.

Among them, one which contains (A) a compound which generates an acid by irradiation with active light or radioactive rays and (B) a resin of which alkali solubility increases by an effect of an acid is preferably used, because this excels in plating resistance, and is suitable for forming a thick layer and suitable as a material for forming a bump.

And as the (B) resin of which the alkali solubility increases by an effect of an acid (referred to as "(B) component" hereinafter), any material can be used with no limitation, as long as it is a resin component which is used in the chemically amplified type positive photoresist composition.

Among them, as mentioned later, it is preferred to use one or two selected from the group consisting of a resin (b1) which contains a constitutional unit represented by the following formula (1) and a resin (b2) which contains a constitutional unit represented by the following formula (2), because such a resin is excellent in developing ability, resolution, anti-plating solution property, and the shape of the resist pattern and of the product derived from plating is excellent and stable, and hence such a resin is suitable for producing a contacting terminal etc. It should be noted that the term "constitutional unit" indicates a monomer unit which constitutes a polymer.

Hereafter, it will be explained in detail.

(A) Compound which Generates Acid by Irradiation with Active Light or Radioactive Rays:

(A) A compound which generates acid by irradiation with active light or radioactive rays (referred to as "(A) component" hereinafter) is an acid generating agent, and it is not limited especially as long as it is a compound which generates acid directly or indirectly by irradiation with light.

Specifically, a halogen containing triazine compound such as
2,4-bis(trichloromethyl)-6-piperonyl-1,3,5-triazine,
2,4-bis(trichloromethyl)-6-[2-(2-furyl)ethenyl]-s-triazine,
2,4-bis(trichloromethyl)-6-[2-(5-methyl-2-furyl)ethenyl]-s-triazine,
2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine,
2,4-bis(trichloromethyl)-6-[2-(3,5-dimethoxyphenyl)ethenyl]-s-triazine,
2,4-bis(trichloromethyl)-6-[2-(3,5-diethoxyphenyl)ethenyl]-s-triazine,
2,4-bis(trichloromethyl)-6-[2-(3,5-dipropoxyphenyl)ethenyl]-s-triazine,
2,4-bis(trichloromethyl)-6-[2-(3-methoxy-5-ethoxyphenyl)ethenyl]-s-triazine,
2,4-bis(trichloromethyl)-6-[2-(3-methoxy-5-propoxyphenyl)ethenyl]-s-triazine,
2,4-bis(trichloromethyl)-6-[2-(3,4-methylenedioxyphenyl)ethenyl]-s-triazine,
2,4-bis(trichloromethyl)-6-(3,4-methylenedioxyphenyl)-s-triazine,
2,4-bis-trichloromethyl-6-(3-bromo-4-methoxy)phenyl-s-triazine,
2,4-bis-trichloromethyl-6-(2-bromo-4-methoxy)phenyl-s-triazine,
2,4-bis-trichloromethyl-6-(2-bromo-4-methoxy)styrylphenyl-s-triazine,
2,4-bis-trichloromethyl-6-(3-bromo-4-methoxy)styrylphenyl-s-triazine,
2-(4-methoxyphenyl)-4,6-bis(trichloromethyl)-1,3,5-triazine,
2-[2-(2-furyl)ethenyl]-4,6-bis(trichloromethyl)-1,3,5-triazine,
2-[2-(5-methyl-2-furyl)ethenyl]-4,6-bis(trichloromethyl)-1,3,5-triazine,
2-[2-(3,5-dimethoxyphenyl)ethenyl]-4,6-bis(trichloromethyl)-1,3,5-triazine,
2-[2-(3,4-dimethoxyphenyl)ethenyl]-4,6-bis(trichloromethyl)-1,3,5-triazine,
2-(3,4-methylenedioxyphenyl)-4,6-bis(trichloromethyl)-1,3,5-triazine, and
tris(1,3-dibromopropyl)-1,3,5-triazine, tris(2,3-dibromopropyl)-1,3,5-triazine, and a halogen containing triazine compound expressed by the following formula (3), such as a tris(2,3-dibromopropyl)isocyanate;

[chemical 1]

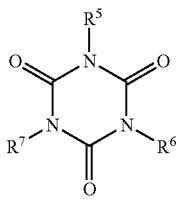

(3)

(In formula (3), each of $R^5$ to $R^7$ may be either the same or different from each other, and represents a halogenated alkyl group) a-(p-toluenesulfonyloxyimino)-phenylacetonitrile, a-(benzenesulfonyloxyimino)-2,4-dichlorophenylacetonitrile, a-(benzene sulfonyloxyimino)-2,6-dichlorophenyl acetonitrile, a-(2-chlorobenzenesulfonyloxyimino)-4-methoxyphenylacetonitrile, a-(ethylsulfonyloxyimino)-1-cyclopentenylacetonitrile, and a compound expressed by the following general formula (4);

[chemical 2]

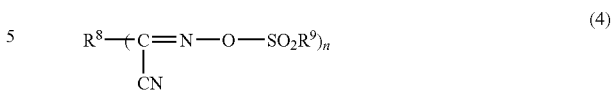

(4)

(In formula (4), $R^8$ represents a monovalent to trivalent organic group, $R^9$ represents a substituted or non-substituted saturated hydrocarbon group, an unsaturated hydrocarbon group, or an aromatic compound group, and n represents a natural number of 1 to 3.)

Here, the aromatic compound group indicates a group of compounds which exhibit physical or chemical characteristics unique to an aromatic compound, for example, an aromatic hydrocarbon group such as a phenyl group, naphthyl group, etc., and a heterocyclic group such as a furyl group, thienyl group, etc., are exemplary. These may have one or more of a suitable substituent on the ring, for example a halogen atom, an alkyl group, an alkoxy group, a nitro group, etc. In addition, $R^9$ is particularly preferably an alkyl group having 1 to 4 carbon atoms, for example, a methyl group, ethyl group, propyl group, and butyl group are exemplary.

The monovalent to trivalent organic group represented by $R^8$ is particularly preferably an aromatic compound group, in particular, a compound of which $R^8$ is an aromatic compound group and of which $R^9$ is a lower alkyl group is preferable.

As the acid generating agent expressed by the above general formula, one $R^8$ which is any one of a phenyl group, methylphenyl group, methoxyphenyl group, when n=1, and $R^9$ is a methyl group, specifically, a-(methylsulfonyloxyimino)-1-phenylacetonitrile, a-(methylsulfonyloxyimino)-1-(p-methylphenyl)acetonitrile, and a-(methylsulfonyloxyimino)-1-(p-methoxyphenyl)acetonitrile are exemplary. As the acid generating agent expressed by the above general formula when n=2, specifically, the acid generating agent expressed by the following formula is exemplary:

[chemical 3]

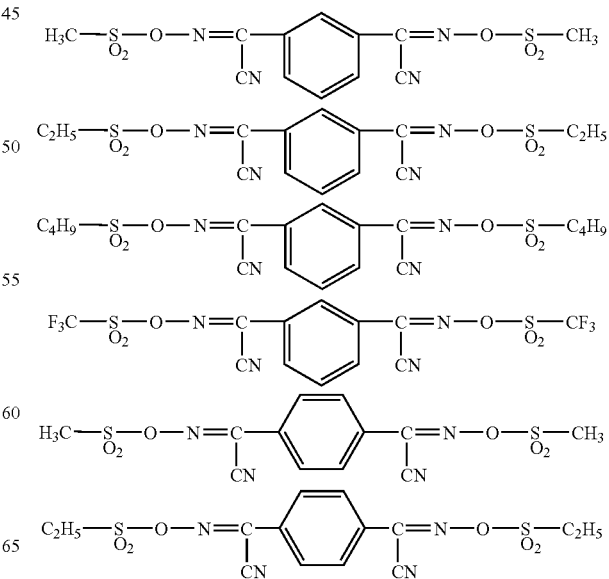

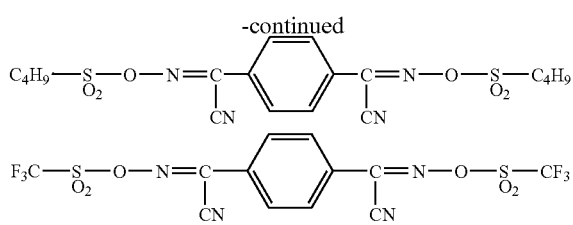

a bissulfonyldiazomethane, such as bis(p-toluenesulfonyl)diazomethane, bis(1,1-dimethylethylsulfonyl)diazomethane, bis(cyclohexylsulfonyl)diazomethane, bis(2,4-dimethylphenylsulfonyl)diazomethane, etc.; a nitrobenzyl derivative such as p-toluenesulfonic acid 2-nitrobenzyl, p-toluenesulfonic acid 2,6-dinitrobenzyl, nitrobenzyltosylate, dinitrobenzyltosylate, nitrobenzylsulfonate, nitrobenzylcarbonate, dinitrobenzylcarbonate, etc.; a sulfonate such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, N-methylsulfonyloxyphthalimide, etc.; a trifluoromethanesulfonate, such as N-hydroxyphthalimide, N-hydroxynaphthalimide, etc.; an onium salt, such as diphenyliodoniumhexafluorophosphate, (4-methoxyphenyl)phenyliodoniumtrifluoromethanesulfonate, bis(p-tert-butylphenyl)iodoniumtrifluoromethanesulfonate, triphenylsulfoniumhexafluorophosphate, (4-methoxyphenyl)diphenylsulfoniumtrifluoromethanesulfonate, (p-tert-butylphenyl)diphenylsulfoniumtrifluoromethanesulfonate, etc.; a benzointosylate, such as benzointosylate, a-methylbenzointosylate, etc.; other diphenyl iodonium salts, a triphenylsulfonium salt, a phenylziazonium salt, a benzylcarbonate, etc. are exemplary.

Among those above, a compound which has at least two oximesulfonate groups expressed by the general formula (5):

(in formula (5), R is substituted or non-substituted, for example, an alkyl group or aryl group having 1 to 8 carbon atoms) is preferable, and in particular, a compound expressed by general formula (6):

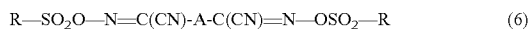

(in formula (6), A is divalent, for example, a substituted or non-substituted alkylene group having 1 to 8 carbon atoms or an aromatic compound group, and R is substituted or non-substituted, for example, an alkyl group or aryl group having 1 to 8 carbon atoms) is preferable.

Here, the aromatic property compound group indicates a group of a compound which exhibits physical or chemical properties unique to an aromatic compound, for example, an aromatic hydrocarbon group such as phenyl group, naphthyl group, and a heterocyclic group, such as furyl group and thienyl group are exemplary.

Each of them may have one or more of a suitable substitutent on the ring, for example, a halogen atom, an alkyl group, an alkoxy group, a nitro group, etc. In addition, in general formula (6), one A which is a phenylene group, and R which is, for example, a lower alkyl group having 1 to 4 carbon atoms are more preferable.

The (A) component may be used solely or two or more thereof may be used in combination.

Moreover, the compounding amount of the (A) component is 0.1 to 20 mass parts to 100 mass parts of the (B) component, preferably 0.2 to 10 mass parts. By setting the compounding amount to be not less than 0.1 mass parts, it becomes possible to obtain sufficient sensitivity, whereas by setting the compounding amount to be not more than 20 mass parts, there is a tendency that the solubility in a solvent increases to obtain a uniform solution and the storage stability increases.

(B) Resin having Solubility in an Alkali which Increases by the Effect of an Acid:

(B) The resin having solubility in an alkali which increases by the effect of an acid (referred to as "(B) component" hereinafter) can be used with no particular limits, as long as it is a resin component which is used in a chemically amplified type positive photoresist composition.

Among them, it is preferred to use one or two selected from the group consisting of (b1) a resin which contains a constitutional unit expressed by the following general formula (1) (referred to as "(b1) component" hereinafter), and (b2) a resin which contains a constitutional unit expressed by the following general formula (2)(referred to as "(b2) component" hereinafter).

(b1) Component:

The (b1) component contains the constitutional unit expressed by the following general formula (1):

[chemical 4]

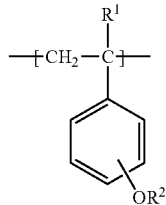

(1)

(in formula (1), $R^1$ represents a hydrogen atom or a methyl group, and $R^2$ represents an acid-unstable group.)

In the above general formula (1), $R^1$ is a hydrogen atom or a methyl group.

$R^2$ is an acid-unstable group. Although various substances can be selected as the acid-unstable group, it is preferred that the acid-unstable group be a group which is expressed by the following general formulae (7) and (8), a linear, a branched, or a cyclic alkyl group having 1 to 6 carbon atoms, a tetrahydropyranyl group, a tetrafuranyl group, or a trialkylsilyl group.

[chemical 5]

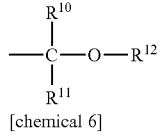

(7)

[chemical 6]

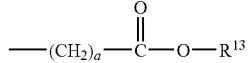

(8)

(In formulae (7) and (8), each of $R^{10}$ and $R^{11}$ is independently a hydrogen atom, a linear or a branched alkyl group having 1 to 6 carbon atoms, $R^{12}$ is a linear, a branched, or a cyclic alkyl group having 1 to 10 carbon atoms. $R^{13}$ is a linear, a branched, or a cyclic alkyl group having 1 to 6 carbon atoms, and n is 0 or 1.)

It should be noted that as a linear, or a branched alkyl group, a methyl group, ethyl group, propyl group, isopropyl group, n-butyl group, iso-butyl group, tert-butyl group, etc. are exemplary, whereas as a cyclic alkyl group, a cyclohexyl group etc. is exemplary.

Here, as the acid-unstable group expressed by the above general formula (7), specifically, for example, a methoxyethyl group, ethoxyethyl group, n-propoxyethyl group, iso-propoxyethyl group, n-butoxyethyl group, iso-butoxyethyl group, tert-butoxyethyl group, cyclohexyoxyethyl group, methoxypropyl group, ethoxypropyl group, 1-methoxy-1-methyl-ethyl group, 1-ethoxy-1-methyl-ethyl group, etc. are exemplary, whereas as the acid-unstable group expressed by the above general formula (8), for example, tert-butoxycarbonyl group, tert-butoxycarbonylmethyl group, etc. are exemplary.

Moreover, as the above trialkylsilyl group, one each of an alkyl group having 1 to 6 carbon atoms, such as trimethylsilyl group, tri-tert-butyldimethylsilyl group, etc. are exemplary.

The (b1) component may contain either one sort of the constitutional unit expressed by the above general formula (1), or two or more of the same each of which differs in structure.

In addition, the (b1) component may contain another polymerizable compound as a monomer in order to suitably control physical or chemical performances. Here, the term "other polymerizable compound" indicates a polymerizable polymer other than the constitutional unit expressed by the above general formula (1).

As such a polymerizable compound, well-known radical-polymerizable compounds and anion-polymerizable compounds are exemplary.

For example, monocarboxylic acid such as acrylic acid, methacrylic acid, and crotonic acid; dicarboxylic acid such as maleic acid, fumaric acid, and itaconic acid; radical-polymerizable compound such as a methacrylic acid derivative having a carboxylic acid and an ester bond, etc., such as 2-methacryloyloxyethyl succinic acid, 2-methacryloyloxyethyl maleic acid, 2-methacryloyloxyethyl phthalic acid, 2-methacryloyloxyethylhexahydrophthalic acid; (meth)acrylic alkyl ester, such as methyl(meth)acrylate, ethyl(meth)acrylate, butyl(meth)acrylate, etc.; (meth)acrylic hydroxyalkylester, such as 2-hydroxyethyl(meth)acrylate, 2-hydroxypropyl(meth)acrylate, etc.; (meth)acrylic arylester, such as phenyl(meth)acrylate, benzyl(meth)acrylate, etc.; dicarboxylic diester, such as diethyl maleate, dibutyl fumarate, etc.;

a vinyl group-containing aromatic compound, such as styrene, a-methyl styrene, chloro styrene, chloromethylstyrene, vinyltoluene, hydroxystyrene, a-methylhydroxystyrene, a-ethylhydroxystyrene; a vinyl group-containing aliphatic compound such as vinyl acetate; conjugated diolefin, such as butadiene, isoprene, etc.; a nitrile group-containing polymerizable compound such as acrylonitrile, methacrylonitrile, etc.; a chlorine containing polymerizable compound such as vinyl chloride, vinylidene chloride, etc.; and amide bond containing polymerizable compound such as acrylamide, methacrylamide, etc. are exemplary.

It should be noted that the (meth)acrylate indicates one or both of methacrylate and acrylate. The (meth)acrylic acid indicates one or both of methacrylic acid and acrylic acid.

(b2) Component:

The (b2) component is a resin which has the constitutional unit expressed by the following general formula (2).

[chemical 7]

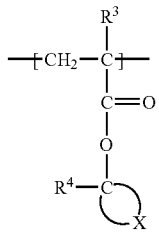

(2)

(in formula (2), $R^3$ represents a hydrogen atom or a methyl group, $R^4$ represents an alkyl group having 1 to 4 carbon atoms, and X forms a hydrocarbon ring having 5 to 20 carbon atoms together with the carbon atom to which X is combined.)

In the above general formula (2), $R^3$ is a hydrogen atom or a methyl group.

The lower alkyl group $R^4$ represents may be either linear or branched, specifically, a methyl group, ethyl group, n-propyl group, isopropyl group, n-butyl group, isobutyl group, sec-butyl group, tert-butyl group, various kinds of pentyl group, etc. are exemplary, however, among these, a lower alkyl group having 2 to 4 carbon atoms is preferable, because it excels in high contrast, resolution, and depth of focus.

Moreover, X forms a monocyclic or a polycyclic hydrocarbon ring having 5 to 20 carbon atoms, together with the carbon atom to which X is combined.

As the monocyclic hydrocarbon ring, cyclopentane, cyclohexane, cycloheptane, cyclooctane, etc. are exemplary.

As the polycyclic hydrocarbon ring, a bicyclic hydrocarbon ring, tricyclic hydrocarbon ring, tetracyclic hydrocarbon ring, etc. are exemplary. Specifically, polycyclic hydrocarbon ring, such as adamantane, norbornane, isobornane, tricyclodecane, and tetracyclododecane, etc. are exemplary.

Among these, as the hydrocarbon ring having 5 to 20 carbon atoms which is formed by X together with the carbon atom to which X is combined, a cyclohexane ring and adamantane ring are particularly preferable.

The (b2) component may contain either one sort of the constitutional unit expressed by the above general formula (2), or two or more of the same each of which differs in structure.

The (b2) component preferably contains further the constitutional unit derived from the polymerizable compound which has an ether bond. By containing this constitutional unit, adhesiveness to the substrate upon being developed and plating-solution resistance are improved.

As a polymerizable compound which has an ether bond, a radical polymerizable compound such as a (meth)acrylic acid derivative having an ether bond and an ester bond, such as 2-methoxyethyl(meth)acrylate, 2-ethoxyethyl(meth)acrylate, methoxytriethylene glycol(meth)acrylate, 3-methoxybutyl(meth)acrylate, ethyl Carbitol(meth)acrylate, phenoxy polyethyleneglycol(meth)acrylate, methoxypolypropyleneglycol(meth)acrylate, tetrahydrofurfuryl(meth)acrylate, etc. are exemplary, and 2-methoxyethyl (meth)acrylate, 2-ethoxyethyl(meth)acrylate, and methoxytriethyleneglycol (meth)acrylate are preferable. Each of these compounds can be used solely or two or more of them can be used in combination.

In addition, the (b2) component may contain another polymerizable compound as a monomer in order to suitably control physical or chemical characteristics. Here, the term "another polymerizable compound" indicates a polymerizable polymer other than the constitutional unit expressed by the above general formula (2) and the constitutional unit which is derived from a polymerizable compound having an ether bond.

As such a polymerizable compound, well-known radical polymerizable compounds and anion polymerizable compounds are exemplary.

For example, a monocarboxylic acid such as acrylic acid, methacrylic acid, and crotonic acid; a dicarboxylic acid such as maleic acid, fumaric acid, and itaconic acid; a radical polymerizable compound such as a methacrylic acid derivative having a carboxylic acid and an ester bond, etc., such as 2-methacryloyloxyethyl succinic acid, 2-methacryloyloxyethyl maleic acid, 2-methacryloyloxyethyl phthalic acid, 2-methacryloyloxyethylhexahydrophthalic acid; a (meth)acrylic acid alkyl ester, such as methyl(meth)acrylate, ethyl (meth)acrylate, butyl(meth)acrylate, etc.; a (meth)acrylic acid hydroxyalkylester, such as 2-hydroxyethyl(meth)acrylate, 2-hydroxypropyl(meth)acrylate, etc.; a (meth)acrylic acid arylester, such as phenyl(meth)acrylate, benzyl(meth)acrylate, etc.; a dicarboxylic acid diester, such as diethyl maleate, dibutyl fumarate, etc.;

a vinyl group-containing aromatic compound, such as styrene, a-methyl styrene, chloro styrene, chloromethylstyrene, vinyltoluene, hydroxystyrene, a-methylhydroxystyrene, a-ethylhydroxystyrene; a vinyl group-containing aliphatic compound such as vinyl acetate; a conjugated diolefin, such as butadiene, isoprene, etc.; a nitrile group-containing polymerizable compound such as acrylonitrile, methacrylonitrile, etc.; a chlorine containing polymerizable compound such as vinyl chloride, vinylidene chloride, etc.; and an amide bond containing polymerizable compound such as acrylamide, methacrylamide, etc. are exemplary.

(C) Alkali-Soluble Resin:

Preferably, the positive photoresist composition further contains (C) an alkali-soluble resin (referred to as "(C) component" hereinafter), in order to control the physical or chemical properties of the composition suitably.

As the (C) component, from those which are conventionally well known as alkali soluble resins in chemically amplified type resist, an arbitrary one can be selected and used suitably. Among these, it is preferable to contain particularly one or more of a resin from the group consisting of (c1) a novolac resin, (c2) a copolymer which has a hydroxystyrene constitutional unit and a styrene constitutional unit, (c3) an acrylic resin, and (C4) a vinyl resin. Preferably the positive photoresist composition further contains the (c1) novolac resin and/or the (c2) copolymer which has a hydroxystyrene constitutional unit and a styrene constitutional unit. This is because it makes it easy to control application properties and developing rate.

(c1) Novolac Resin:

The novolac resin which is the (c1) component is obtained by, for example, performing an addition condensation of an aromatic compound (referred to simply as "phenols" hereinafter) which has a phenolic hydroxyl group and an aldehyde in the presence of an acid catalyst.

As the phenols used for this, for example, phenol, o-cresol, m-cresol, p-cresol, o-ethylphenol, m-ethylphenol, p-ethylphenol, o-butyl phenol, m-butylphenol, p-butyl phenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone mono-methylether, pyrogallol, fluoroglycinol, hydroxydiphenyl, bisphenol A, gallic acid, gallic acid ester, a-naphthol, β-naphthol, etc. are exemplary.

Moreover, as aldehydes, for example, formaldehyde, furfural, benzaldehyde, nitrobenzaldehyde, acetaldehyde, etc. are exemplary.

Although the catalyst when performing an addition condensation is not particularly limited, for example, as for an acid catalyst, hydrochloric acid, nitric acid, sulfuric acid, formic acid, oxalic acid, acetic acid, etc. are used.

In particular, the novolac resin using only m-cresol as a phenol excels especially in the developing profile, and is preferable.

The polystyrene equivalent mass average molecular weight (referred to as "mass average molecular weight" hereinafter) by gel permeation chromatography of the (c1) component is preferably, for example, 3,000 to 50,000.

(c2) Copolymer which has a Hydroxy Styrene Constitutional Unit and a Styrene Constitutional Unit:

The (c2) component is a copolymer which has at least a hydroxy styrene constitutional unit and a styrene constitutional unit. That is, it is a copolymer which consists of a hydroxy styrene constitutional unit and a styrene constitutional unit, and a copolymer which consists of a hydroxy styrene constitutional unit, a styrene constitutional unit, and constitutional units other than those.

As the hydroxy styrene constitutional unit, for example, a hydroxy styrene constitutional unit such as p-hydroxystyrene, an a-alkylhydroxy styrene such as a-methylhydroxy styrene, a-ethylhydroxy styrene, etc. are exemplary.

As the styrene constitutional unit, for example, styrene, chlorostyrene, chloromethyl styrene, vinyltoluene, a-methylstyrene, etc. are exemplary.

The mass average molecular weight of the (c2) component is preferably 1,000-30,000, for example.

(c3) Acrylic Resin:

The acrylic resin which is the (c3) component is not particularly limited, as long as it is an alkali-soluble acrylic resin, however, it is particularly preferable that the acrylic resin contains the constitutional unit which is derived from a polymerizable compound having an ether bond, and the constitutional unit which is derived from a polymerizable compound having a carboxyl group.

As the polymerizable compound which has an ether bond, a (meth)acrylic acid derivative having an ether bond and an ester bond, such as 2-methoxyethyl(meth) acrylate, methoxytriethyleneglycol(meth)acrylate, 3-methoxybutyl(meth)acrylate, ethyl carbitol(meth)acrylate, phenoxypolyethyleneglycol(meth)acrylate, methoxypolypropyleneglycol(meth)acrylate, tetrahydrofurfuryl(meth)acrylate, etc. are exemplary. 2-Methoxyethylacrylate and methoxytriethyleneglycolacrylate are preferable. Each of these compounds can be used solely or two or more of them can be used in combination.

As the polymerizable compound which has a carboxyl group, a monocarboxylic acid such as acrylic acid, methacrylic acid, and crotonic acid; a dicarboxylic acid such as maleic acid, fumaric acid, and itaconic acid; a compound having a carboxylic group and an ester bond, such as 2-methacryloyloxyethyl succinic acid, 2-methacryloyloxyethyl maleic acid, 2-methacryloyloxyethyl phthalic acid, 2-methacryloyloxyethylhexahydrophthalic acid, etc. are exemplary. Acrylic acid, and methacrylic acid are preferable. Each of these compounds can be used solely or two or more of them can be used in combination.

The mass average molecular weight of the (c3) component is, for example, 10,000 to 800,000, preferably 30,000 to 500,000.

(c4) Vinyl Resin:

The vinyl resin which is the (c4) component is a poly (vinyl lower alkyl ether), and consists of a (co)polymer which is obtained by polymerizing a single vinyl lower alkyl ether expressed by the following general formula (9) or a mixture consisting of two or more.

[chemical 8]

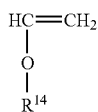

(9)

(In the above general formula (9), $R^{14}$ represents a linear or a branched alkyl group having 1 to 5 carbon atoms.)

In general formula (7), as the linear or branched alkyl group having 1 to 5 carbon atoms, for example, a methyl group, ethyl group, n-propyl group, i-propyl group, n-butyl group, i-butyl group, n-pentyl group, etc. are exemplary. Among these alkyl groups, a methyl group, ethyl group, and i-butyl group are preferable, in particular, a methyl group is preferable. The especially preferable poly(vinyl lower alkyl ether) is poly(vinyl methyl ether).

The mass average molecular weight of the (c4) component is, for example, 10,000 to 200,000, preferably 50,000 to 100,000.

The compounding amount of the above (C) component is 0 to 300 mass parts to 100 mass part of the (B) component, preferably 0 to 200 mass part. If it is not more than 300 mass parts, then it is possible to suppress the deterioration of contrast between an exposed part and a non-exposed part for forming a pattern, and the thickness loss.

(D) Acid Diffusion Controlling Agent:

The positive photoresist composition preferably contains further (D) an acid diffusion controlling agent (referred to as "(D) component" hereinafter), in order to improve the resist pattern shape, the pattern-wise exposure of the resist layer (PED: post exposure delay), etc.

As the (D) component, an arbitrary one may be selected to be used suitably from those which are well known hitherto as an acid diffusion controlling agent in a chemically amplified type photoresist. In particular, it is preferred that (d1) a nitrogen-containing compound be contained, and further (d2) an organic carboxylic acid, an oxoacid of phosphorus, or derivative thereof may be contained, if it is required.

(d1) Nitrogen Containing Compound:

As the nitrogen containing compound which is the (d1) component, for example, trimethylamine, diethylamine, triethylamine, di-n-propylamine, tri-n-propyl amine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylendiamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrolidone, N-methylpyrolidone, methylurea, 1,1-dimethylurea, 1,3-dimethylurea, 1,1,3,3-tetramethylurea, 1,3-diphenylurea, imidazole, benzimidazole, 4-methylmidazole, 8-oxyquinoline, acridine, purine, pyrrolidine, piperidine, 2,4,6-tri (2-pyridyl)-S-triazine, morpholine, 4-methyl morpholine, piperazine, 1,4-dimethyl piperazine, 1,4-diazabicyclo[2.2.2]octane, etc. are exemplary.

Among these, particularly an alkanolamine such as triethanolamine is preferable.

Each of these compounds can be used solely or two or more of them can be used in combination.

In general, the (d1) component is used in an amount ranging from 0 to 5 mass % in the case in which the (B) component is set to be 100 mass %, in particular, being used in an amount ranging from 0 to 3 mass % is preferable.

(d2) Organic Carboxylic Acid, an Oxoacid of Phosphorus or a Derivative Thereof:

As the organic carboxylic acid, for example, malonic acid, citric acid, malic acid, succinic acid, benzoic acid, salicylic acid, etc. are preferable, and particularly salicylic acid is preferable.

As the oxoacid of phosphorus or the derivative thereof, phosphoric acid or the derivative thereof such as esters thereof, such as phosphoric acid, phosphoric acid di-n-butylester, phosphoric acid diphenylester, etc., phosphonic acid and the derivative thereof such as an ester thereof, such as phosphonic acid, phosphonic acid dimethylester, phosphonic acid-di-n-butylester, phenylphosphonic acid, phosphonic acid diphenylester, phosphonic acid dibenzylester, etc., a phosphinic acid and the derivative thereof such as an ester thereof, such as phosphinic acid, phenyl phosphinic acid, etc. are exemplary, and among these, phosphonic acid is particularly preferable. Each of these compounds can be used solely or two or more of them can be used in combination.

In general, the (d2) component is used in an amount ranging from 0 to 5 mass % in the case in which the (B) component set to be 100 mass %, in particular, an amount ranging from 0 to 3 mass % is preferable.

Moreover, against the (d1) component, the (d2) component is preferably used in an amount which is equivalent to that of the (d1) component. This is because the (d2) component and the (d1) component form a salt to be stabilized.

In addition, if it is required, the positive photoresist composition may contain additives with miscibility, for example, those commonly used, such as an additive resin for improving the performance of the resist film, a plasticizer, an adhesive auxiliary, a stabilizer, a coloring agent, a surfactant, etc.

Furthermore, the positive photoresist composition may contain an organic solvent suitably for adjusting the viscosity. As the above organic solvent, specifically, a ketone such as acetone, methyl ethyl ketone, cyclohexanone, methylisoamylketone, 2-heptanone, etc.; a polyhydric alcohol and derivative thereof, such as ethylene glycol, ethylene glycol mono-acetate, diethylene glycol, diethylene glycol mono-acetate, propylene glycol, propylene glycol mono-acetate, mono-methylether, mono-ethylether, mono-propylehter, moto-butylether, or mono-phenylether of dipropylene glycol or dipropylene glycol mono-acetate, etc.; a cyclic ether such as dioxane; and an ester such as methyl lactate, ethyl lactate, methyl acetate, ethyl acetate, butyl lactate, acetic acid methyl, ethyl acetate, butyl acetate, methyl pyruvate, ethyl pyruvate, methoxy methyl propionate, ethoxy ethyl propionate, etc. are exemplary. Each of these compounds can be used solely or two or more of them can be used in combination.

For example, in order to obtain a film with a thickness of not less than 10 μm, these solvent is preferably used in such an amount that the solids concentration ranges from 30 mass % to 65 mass %. If the solids concentration is not less than 30 mass %, then a thick film suitable for producing a contacting terminal can be obtained, whereas if the solid concentration is not more than 65 mass %, then deterioration in flowability of the composition can be suppressed. As a result, a resist film which is easy to be handled, and uniform can be obtained by a spin-coat method.

The positive photoresist composition can be prepared by, for example, simply mixing and stirring each or the above components in an ordinal method, and if necessary, a dispersing apparatus such as a dissolver, a homogenizer, a triple roll mill, etc. may be used to disperse and mix the components. Moreover, after being mixed, the composition may be filtered through a mesh filter, a membrane filter, etc.

The thickness of the (c) layer is 1 μm to 1 mm, preferably 10 μm to 1 mm, more preferably 20 μm to 1 mm, in particular as a single layer the thickness is preferably 20 μm to 150 μm, more preferably 20 to 80 μm, in view of applicability to a thick film. It should be noted that the (c) layer may be either a single layer, or multiple layers by laminating two or more of layers. The photoresist laminate thus obtained is subjected to a subsequent exposure step.

(Exposure Step)

A selective exposure is performed by irradiating active light, or radioactive rays, such as ultraviolet rays having a wavelength of 300 to 500 nm or visible rays through a predetermined mask pattern, onto the (c) layer of the photoresist laminate obtained in the laminating step. As a radiation source of active light or radioactive rays, a low-pressure mercury lamp, a high-pressure mercury lamp, an extra-high-voltage mercury lamp, a metal halide lamp, an argon gas laser, etc. can be used.

Here, the term "active light" indicates light which activates an acid-generating agent in order to generate an acid.

Here, the term "radioactive rays" indicates ultraviolet rays, visible light, far ultraviolet rays, X-rays, electron beams, ionic rays, etc.

The irradiating amount of active light or radioactive rays is, for example, for a 20 μm in thickness, 100 to 3000 mJ/cm$^2$, in the case of using an extra-high-voltage mercury lamp, although it differs depending on the kind of each of component in the photoresist composition, the compounding amount of the same, the thickness of the (c) layer, etc.

After the selective exposure is performed in this way, preferably it is subjected to a heating step (PEB treatment), thereby moderately diffusing the acid derived from the acid-generating agent.

(Developing Step)

In the developing step, the exposed part is dissolved and removed, using an alkali developing solution. At this time, the exposed part of the (c) layer dissolves in the developing solution. Then, the (b) layer which exists under the exposed part of the (c) layer also comes into contact with the alkali developing solution. And the (b) layer dissolves in the alkali developing solution.

Accordingly, in the developing step, the (b) layer of the exposed part and the (c) layer can be developed to be removed simultaneously.

As the developing solution, for example, an aqueous solution of an alkali, such as sodium hydroxide, potassium hydroxide, sodium carbonate, sodium silicate, meta-sodium silicate, ammonia solution, ethylamine, n-propyl amine, diethyl amine, di-n-propyl amine, triethyl amine, methyl diethyl amine, dimethyl ethanol amine, triethanol amine, tetra-methyl ammonium hydroxide (TMAH), tetra-ethyl ammonium hydroxide, pyrrole, piperidine, 1,8-diazabicyclo [5,4,0]-7-undecene, 1, and 5-diazabicyclo [4,3,0]-5-nonane, etc. can be used, and an aqueous TMAH solution having a concentration of approximately 0.1 to 10 mass % is preferable.

Moreover, an aqueous solution of an alkali in which a suitable amount of water-soluble organic solvents such as methanol and ethanol, and surfactants are added can also be used as the developing solution.

As for the developing method, any method such as a dipping method, paddle method, and spray developing method, can be used.

The developing time is, although it differs depending on conditions, generally approximately 1 to 30 minutes, for example.

It should be noted that what is necessary is that as for the (b) layer and the (c) layer in the developing step, the resist pattern which is obtained in the developing step can be treated such that the (b) layer as well as the (c) layer can be developed, for example, the developing step may be repeated plural times. However, it is preferred that both the (b) layer and the (c) layer be removed in one developing step, in view of ease of the treatment.

After the developing step, preferably it is subjected to washing with running water for 30 to 90 seconds, and to air-drying using an air-gun, etc. or to drying in an oven.

[Process for Producing a Conductor Pattern]

The process for producing a conductor pattern on the present invention includes the step of forming a conductor pattern to a non-resist part (exposed part) of the resist pattern which is obtained by the process for producing a conductor pattern of the present invention.

The conductor pattern can be formed by, for example, using gold, copper, nickel, solder, etc.

As the method for forming a conductor pattern, the method for laminating the above (b) layer is exemplary, however, a plating method etc. is preferable. The plating method is not particularly limited, and various plating methods which are well known well hitherto can be used.

Thereby it is possible to form a bump, a metal post, wiring, rewiring, etc.

According to the present invention, the influence on the (c) layer of the copper contained in the (a) layer can be decreased by using the (b) layer.

Moreover, because the (b) layer consists of an inorganic substance, it is possible to form easily a film having stable performance, without strictly controlling and managing severely in the production, thereby making the controlling and managing in the production easy. Moreover, no mixing against the (c) layer may occur. Moreover, according to the process of the present invention, the (b) layer as well as the (c) layer are developed, thereby requiring no special treatment necessary upon being developed, without increasing the number of steps.

Thus, the (b) layer can be formed easily, and the (b) layer has stable performance without causing the mixing to the (c) layer, and as a result, the (c) layer is not affected by the (b) layer, thereby enabling the (c) layer to be produced stably.

EXAMPLE

Although examples of the present invention will be explained below, the scope of the present invention is not limited to these examples.

It should be noted that, unless otherwise noted, a part indicates a weight part, and % indicates weight %. The term "degrees of dispersion" indicates a mass average molecular weight/number average molecular weight, in the following examples.

Synthesis Example 1

Synthesizing of the Resin of which Solubility in an Alkali Increases by an Effect of (B1-1) Acid A flask equipped with a stirrer, a reflux condenser, a thermometer, and a driptank was substituted with nitrogen gas, and thereafter the flask was charged with propylene glycol methyl ether acetate as a solvent, and then stirring was started. Thereafter, the temperature of the solvent was elevated to 80° C. The driptank was charged with 2,2'-azobisisobutyronitrile, 39 mol % of a constitutional unit expressed by the general formula (1) in which $R^1$ is a hydrogen atom and $R^2$ is tert-butyloxycarbonyl group as the (b1), and 61 mol % of a hydroxystyrene constitutional unit, and was stirred until the polymerization catalyst was dissolved, and thereafter the resultant solution was uniformly dripped into the flask for 3 hours, then successive polymerization was performed at 80° C. for 5 hours. Thereafter, the reaction solution was cooled to room temperature to obtain a resin (B1-1) having a mass average molecular weight of 10,000 and a degree of dispersion of 1.5.

Synthesis Example 2

Synthesizing of the Resin of which Solubility in an Alkali Increases by an Effect of (B1-2) Acid A resin (B1-2) having a mass average molecular weight of 10,000 and a degree of dispersion of 1.5 was obtained by performing the same process as in the Synthesis example 1, with the exception of using 39 mol % of a constitutional unit expressed by the general formula (1) in which $R^1$ is a hydrogen atom and $R^2$ is an ethoxyethyl group as the (b1).

Synthesis Example 3

Synthesizing of the Resin of which Solubility in an Alkali Increases by an Effect of (B2-1) Acid A resin (B2-1) having a mass average molecular weight of 350,000 was obtained by performing the same process as in the Synthesis example 1, with the exception of using 50 mass % of a 1-ethylcyclohexylmethacrylate constitutional unit as the (b1) and 50 mass % of a 2-ethoxyethylacrylate constitutional unit as the (b2).

Synthesis Example 4

Synthesizing of the Resin of which Solubility in an Alkali Increases by an Effect of (B2-2) Acid A resin (B2-2) having a mass average molecular weight of 350,000 was obtained by performing the same process as in the Synthesis example 1, with the exception of using 50 mass % of an adamantlyacrylate constitutional unit as the (b1) and 50 mass % of a 2-ethoxyethylacrylate constitutional unit as the (b2).

Synthesis Example 5

(C-1) Synthesis of Novolac Resin m-cresol and p-cresol were mixed at a rate of mass ratio of 60:40, and formalin was added thereto, and then the resultant mixture was condensed by an ordinary method using oxalic acid as a catalyst to obtain a cresol novolac resin. This resin was subjected to a fractionation treatment to eliminate lower molecular domains thereby obtaining a novolac resin having a mass average molecular weight of 15,000. This resin was named (C-1).

Synthesis Example 6

(C-2) Synthesis of a Copolymer which has a Hydroxystyrene Constitutional Unit and a Styrene Constitutional Unit A resin (C-2) having a mass average molecular weight of 3,000 was obtained by performing the same process as in the Synthesis example 1, with the exception of using 75 mass % of the hydroxystyrene unit and 25 mass % of the styrene unit as the constitutional unit.

Synthesis Example 7

Synthesis of (C-3) Acrylic Resin

A resin (C-3) having a mass average molecular weight of 250,000 was obtained by performing the same process as in the synthesis example 1, with the exception of using 130 mass parts of 2-methoxyethylacrylate, 50 mass parts of benzylmethacrylate, and 20 mass parts of acrylic acid.

Synthesis Example 8

Synthesis of (C-4) Polyvinyl Resin

A methanol solution (produced by TOKYO KASEI KOGYO Co., Ltd., concentration 50 mass %) of poly(vinylmethylether)(mass average molecular weight of 50,000) was subjected to a solvent substitution with propyleneglycol-monomethyletheracetate using a rotary evaporator to obtain (C-4) solution having a concentration of 50 mass %.

Examples 1 to 12

Preparation of a Chemically Amplified Type Positive Photoresist Composition for a Thick Film Each of the components shown in Table 1 was mixed with propyleneglycol-monomethyletheracetate to obtain a uniform solution, and thereafter the solution was filtered by being passed through a membrane filter with pore size of 1 μm to obtain a positive chemically amplified type photoresist composition. The following performance evaluation was performed under the conditions shown in Table 2, using the resultant composition. The results are shown in Table 2.

The following two substances were used as an acid generating agent which is the (A) component.

(A-1): 5-propylsulfonyloxyimino-5H-thiophene-2-ylidene-(2-methylphenyl)acetonitrile (A-2): The Compound Expressed by the Following Chemical Formula

[chemical 9]

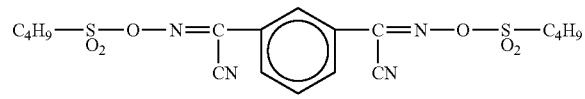

Moreover, in Table 1, (D-1) indicates salicylic acid and (D-2) indicates triethanolamine. It should be noted that the numerical value in Table 1 indicates the mass part of each component.

TABLE 1

| | Examples | | | | | | |
|---|---|---|---|---|---|---|---|
| | 1 | 2 | 3 | 4 | 5 | 6 | 7-12 |
| A-1 | | | | | | 1 | |
| A-2 | 1 | 1 | 1 | 1 | 1 | | 1 |
| B1-1 | 10 | 10 | 10 | 10 | 70 | | 10 |
| B1-2 | 10 | 10 | 10 | 10 | | | 10 |
| B2-1 | 50 | 50 | 50 | | | 70 | 50 |
| B2-2 | | | | 50 | | | |
| C-1 | 30 | | | | 30 | | 30 |
| C-2 | | 30 | | | | 30 | |
| C-3 | | | 30 | | | | |
| C-4 | | | | 30 | | | |
| D-1 | 0.1 | 0.1 | 0.1 | 0.1 | 0.1 | | 0.1 |
| D-2 | 0.1 | 0.1 | 0.1 | 0.1 | 0.1 | | 0.1 |

Comparative Example 1

With No (b) Inorganic Substance Layer

When the same treatment was performed as in Example 1 with the exception that there was no (b) inorganic substance layer, it was revealed that the resist flowed upon being developed in response to the influence of the (a) support, thereby it was not possible to form a pattern. The evaluation result is shown in Table 2.

Comparative Example 2

Shielding layer

Preparation of the shielding layer material

Synthesis Example 9

3 g of 4,4'-bis(diethylamino)benzophenone as an ultraviolet absorbing agent, 5 g of a melamine derivative (produced by SANWA CHEMICAL Co., Ltd., Mx-750) in which an average of 3.7 methoxymethyl groups are substituted per one melamine ring as a crosslinking agent, and 5 g of 2,2,4,4'-tetrahydroxybenzophenone were dissolved in 150 g of propyleneglycol-monomethyletheracetate. In addition, 1000 ppm of a fluorine type surfactant (produced by SUMITOMO 3M Co., Ltd., Fc-430) was dissolved thereinto, and thereafter the resultant solution mixture was filtered through a membrane filter with a pore size of 0.2 μm to prepare a shielding layer material.

When the same treatment as in Example 1 was performed except that the shielding layer material in Synthesis Example 9 was applied to a 5-inch copper sputtering wafer, and then it was heated at 150° C. for 10 minutes to form a (b) shielding layer with a predetermined thickness, it was revealed that that the resist flowed upon being developed in response to the influence of the (a) support due to the mixing between the (b) layer and the (c) layer, thereby it was not possible to form a pattern. The evaluation result is shown in Table 2.

Comparative Example 3

Shielding Layer

When the same treatment as in Example 1 was performed except that the shielding layer material in Synthesis Example 9 was applied to a 5-inch copper sputtering wafer, and then it was heated at 200° C. for 10 minutes to form a (b) shielding layer with a predetermined thickness, it was revealed that the shielding layer could not developed. The evaluation result is shown in Table 2.

Comparative Example 4

Copper Oxide Film

A 5-inch copper sputtering wafer was baked at 300° C. for 20 minutes to form a copper oxide film on the wafer. The thickness of the copper oxide film on the wafer was measured by a cross section SEM, and as a result, it was confirmed that the thickness of the film was at least 3000 Å. When the same treatment as in Example 1 was performed other than this, it revealed that the (b) shielding layer could not be developed. The evaluation result is shown in Table 2.

[Performance Evaluation]—Developing Ability

A (b) layer with a specific thickness was formed onto (a) a 5 inches copper sputtering wafer, using a specific (b) inorganic substance target through a sputtering method. And thereafter, each of components was applied thereto at 1800 rpm for 25 seconds, such that the thickness becomes approximately 20 μm, using a spinner, and then the resultant wafer was subjected to a prebaking at 110° C. for 6 minutes on a hot plate to form a photoresist laminate.

As for a coated film with a thickness of approximately 120 μm, application was performed at 800 rpm for 25 seconds, and thereafter prebaking was performed at 110° C. for 1 minute on a hot plate, and further application was performed at 500 rpm for 25 seconds, and then prebaking was performed at 110° C. for 20 minutes to form a photoresist laminate.

As for a coated film with a thickness of approximately 500 μm, application was performed such that the thickness of film after being dried became approximately 500 μm, using an applicator, and thereafter prebaking was performed at 120° C. for 2 hours to form a photoresist laminate.

To each of the above thick photoresist laminates thus obtained, ultraviolet-ray exposure was performed stepwisely within a range of 100 to 10,000 mJ/cm², using a stepper (made by Nikon Co., Ltd., model NSR-2005i10D) through a pattern mask for measuring resolution. After the exposure, each laminate was heated at 70° C. for 5 minutes, and thereafter the resultant laminate was developed with a developing solution (brand name PMER SERIES, P-7G, produced by TOKYO OHKA KOGYO Co., Ltd.).

Thereafter, each laminate was washed with running water, then subjected to nitrogen blowing to obtain a pattern like cured material. This cured material was observed by a microscope and the developing ability was evaluated in accordance with the following evaluation standard.

O: A state in which the (b) layer and the (c) layer of the exposed part were developed, whereas both the (b) layer and the (c) layer of the non-exposed part were not developed.

X: A state in which the (b) layer and the (c) layer of the exposed part were not developed, alternatively the (b) layer of the non-exposed part or the (c) layer of non-exposed part was developed.

Heat Stability

Using the substrate having the pattern like cured material obtained in the above "developing and resolution evaluation" as a test piece, the stability after the prebaking and developing treatment of the (b) layer and the (c) layer were evaluated in accordance with the following evaluation standard:

O: No mixing could be seen in both the (b) layer and the (c) layer, and hence it was stable.

X: Mixing could be seen in both the (b) layer and the (c) layer.

Shape of Bumps

Using the substrate having the pattern like cured material obtained in the above "developing and resolution evaluation" as a test piece, ashing treatment was performed with oxygen plasma, and thereafter the resultant test pieces were immersed in a copper sulfate plating solution at 23° C. for 30 minutes, then washed with running water to obtain treated test pieces. The state of the formed bump and the pattern like cured material were observed by an optical microscope or an electron microscope to evaluate the shape of the formed bumps in accordance with the following evaluation standard:

O: The shape of the bump depends (follows) on the pattern like cured material, and hence it is good.

X: The shape of bump does not depend on the pattern like cured material, and swells.

Each of the positive photoresist compositions prepared in Examples 1 to 12, and Comparative Examples 1 to 4 was evaluated by performing each above test thereon. The result is shown in Table 2. It should be noted that in the evaluating method, as to Comparative Examples 1 to 4, it differs only in that no shielding layer is formed, or, that no inorganic substance layer which consists of the inorganic substance supplied from the inorganic substance source, which is essential for the present invention, is formed. Moreover, in Table 2, the term "note" indicates that the shielding layer is formed with a material other than the inorganic substance.

INDUSTRIAL APPLICABILITY

The present invention is applicable to a process for producing a resist pattern and a conductor pattern.

The invention claimed is:

1. A process for producing a resist pattern comprising:
   laminating (a) a support having an upper surface comprising copper, (b) an inorganic substance layer consisting of an inorganic substance supplied from an inorganic substance source on the upper surface of said (a) support, and (c) a photoresist layer consisting of a chemically amplified type positive photoresist composition on the upper surface of said (b) inorganic substance layer, to obtain a photoresist laminate;

selectively irradiating active light or radioactive rays to said photoresist laminate; and developing both said (b) inorganic substance layer and said (c) photoresist layer, thereby removing together both the exposed part of the (c) photoresist layer and the (b) inorganic substance layer which exists under the exposed part of the (c) photoresist layer so as to form a resist pattern, wherein the inorganic substance is at least one selected from the group consisting of Al, Zn, Mo, Sn, Pb, and ITO.

2. The process for producing a resist pattern as set forth in claim 1, wherein the thickness of the (b) inorganic substance layer is 0.05 nm to 1 μm.

3. The process for producing a resist pattern as set forth in claim 1, wherein the thickness of the (c) photoresist layer is 10 μm to 1 mm.

4. The process for producing a resist pattern as set forth in claim 1, wherein the inorganic substance source supplies Al to form the (b) inorganic substance layer which contains Al, by at least one method selected from the group consisting of sputtering, vapor deposition, and plating.

5. The process for producing a resist pattern as set forth in claim 1, wherein the chemically amplified type positive photoresist composition contains (A) a compound which generates an acid by irradiation with active light or radioactive rays

TABLE 2

|  | Examples | | | | | | | Comparative Examples | | | |
| --- | --- | --- | --- | --- | --- | --- | --- | --- | --- | --- | --- |
|  | 1-6 | 7 | 8 | 9 | 10 | 11 | 12 | 1 | 2 | 3 | 4 |
| Thickness of (c) layer | 20 μm | 20 μm | 20 μm | 120 μm | 500 μm | 20 μm | 20 μm | 20 μm | 20 μm | 20 μm | 20 μm |
| Thickness of (b) layer | 1 nm | 50 nm | 1 μm | 50 nm | 50 nm | 50 nm | 50 nm | — | 50 nm | 50 nm | 300 nm |
| Inorganic substance | Al | Al | Al | Al | Al | Mo | Zn | — | note | note | CuO |
| Developability | O | O | O | O | O | O | O | X | X | X | X |
| Thermal stability | O | O | O | O | O | O | O | — | X | O | O |
| Bump shape | O | O | O | O | O | O | O | — | — | — | — | and (B) a resin of which alkali solubility increases by an effect of an acid in which said (B) component contains one or more resins selected from the group consisting of: (b1) a resin which contains a constitutional unit represented by the following general formula (1):

[chemical 1]

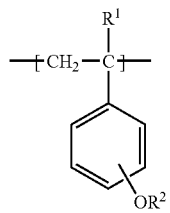

(1)

(in formula (1), $R^1$ represents a hydrogen atom or a methyl group, and $R^2$ represents an acid-unstable group), and (b2) a resin which contains a constitutional unit represented by the following general formula (2):

[chemical 2]

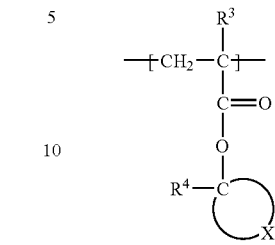

(2)

(in formula (2), $R^3$ represents a hydrogen atom or a methyl group, $R^4$ represents an alkyl group having 1 to 4 carbon atoms, and X forms a hydrocarbon ring having 5 to 20 carbon atoms together with the carbon atom to which X is combined).

6. A process for producing a conductor pattern comprising forming a conductive pattern on the non-resist part of the resist pattern obtained by the process for forming a resist pattern as set forth in claim 1.

7. The process for producing a resist pattern as set forth in claim 1, wherein the inorganic substance consists of Al.

* * * * *